Figure 1:
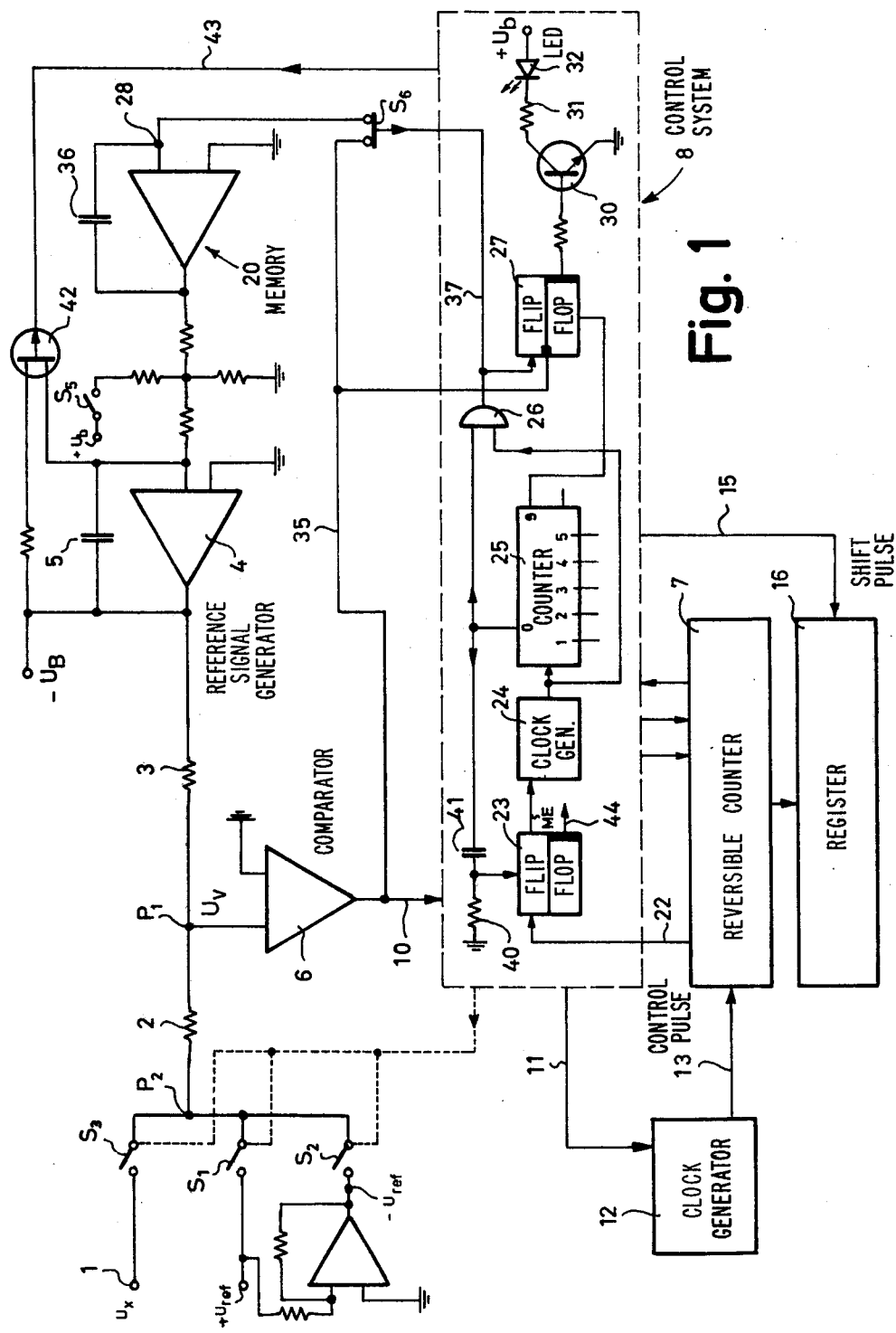

United States Patent [19]

Becker

[11] 4,118,698

[45] Oct. 3, 1978

[54] ANALOG-TO-DIGITAL CONVERTER RECALIBRATION METHOD AND APPARATUS

[76] Inventor: Manfred Becker, Waldstrasse 22, 6301 Rabenau, Fed. Rep. of Germany

[21] Appl. No.: 805,306

[22] Filed: Jun. 10, 1977

[30] Foreign Application Priority Data

Jun. 16, 1976 [DE] Fed. Rep. of Germany ....... 2626899

[51] Int. Cl.² ............................................ H03K 13/20
[52] U.S. Cl. ........................ 340/347 CC; 340/347 AD
[58] Field of Search .... 340/347 M, 347 CC, 347 AD, 340/347 MT; 324/130; 328/162

[56] References Cited

U.S. PATENT DOCUMENTS

| | | | |
|---|---|---|---|
| 2,897,486 | 7/1959 | Alexander | 340/347 M |
| 3,506,818 | 4/1970 | Smith | 340/347 M |
| 3,750,142 | 7/1973 | Barnes | 340/347 CC |
| 3,961,325 | 6/1976 | Kendall | 340/347 AD |

Primary Examiner—Charles D. Miller

Attorney, Agent, or Firm—Wolf, Greenfield & Sacks

[57] ABSTRACT

Automatic recalibration and testing of the accuracy of an analog-to-digital converter is accomplished in a converter of the type that compares the analog input signal with a linearly changing ramp referene signal and measures the time interval required for the magnitude of the reference signal to reach the level of the analog input signal from an initial level. In the invention, the linearly changing ramp reference signal is allowed to continue beyond the end of the converter's measuring phase and is thereupon compared with a datum voltage by a comparator which determines when equality between the two occurs. At the end of the measuring phase, a control pulse of fixed duration is generated and if the time of occurrence of equality is within the duration of that pulse, the converter is then operating within a suitable range of accuracy. The converter is automatically recalibrated by adjustment of the reference signal to make equality of the reference signal and the voltage datum occur in the center of the duration of the control pulse.

6 Claims, 2 Drawing Figures

ANALOG-TO-DIGITAL CONVERTER RECALIBRATION METHOD AND APPARATUS

This invention relates in general to the automatic recalibration of an analog-to-digital converter to maintain the converter's accuracy. More particularly, the invention relates to the maintenance of the accuracy of analog-to-digital converters of the type that compares the analog input signal with a linearly changing reference signal and measures the time interval required for the reference signal to reach the level of the input signal from a datum level. In that type of converter, the time interval is measured by counting clock pulses emitted in that interval by an electronic clock.

Analog-to-digital converters are generally known and their fundamental construction is described, for example, in the article "Die Grundlage digitaler Spannungsmesser" ("The principle of digital voltmeters") by Manfred Klose, published in the journal "Elektronik", Volume 1968, No. 2 and No. 4, on pages 37–40 and 117–120 respectively. According to this article, analog to digital conversion is performed by comparing the analog input signal with a reference voltage that rises linearly or in regular steps. At the start of the measurement, a pulse counter commences to count clock pulses emanating from a clock and the count in the counter is read out upon the emission from a comparator of a signal indicating that the reference voltage has become equal to the input analog signal. A digital measure of the voltage value of the analog input signal is obtained by recording the pulse count when voltage identity occurred. However, disadvantages of this conversion method reside in the inaccuracies that occur in the generation of the linearly rising reference voltages, i.e. in the slope thereof, and in the tendency of the oscillator from which the clock pulses are derived to change its frequency. It is therefore necessary to refer the frequency of the oscillator to the generated sawtooth voltage or reference voltage and to synchronize it so that it is possible to obtain a measured result that can be evaluated because the errors which are inherent in the individual components, for example the drift of amplifier and comparator circuits, give rise to errors which must be countered by recalibration from time to time.

German Offenlegungsschrift No. 2,108,329 discloses an analog to digital converter in which the sawtooth voltage, described in the specification as a ramp voltage, is compared at pre-defined times with reference signals of opposite polarity. In that converter, a feedback circuit controls the oscillator and adjusts its frequency so that the sawtooth voltage and the oscillator frequency are adapted to each other or that the count number during an interval in the reference time is held at a given number. This avoids measuring errors due to a change in oscillator frequency, independently of any change of slope of the sawtooth voltage.

The oscillator of the pulse generator must be of the type whose frequency can be readily adjusted to enable the repetition rate of the pulse generator to be related to the slope of the sawtooth voltage. Consequently crystal-controlled oscillators cannot be used because they do not permit adjustment of the frequency of oscillation whereas voltage controlled oscillators are readily suited for the purpose because of the ease of altering the oscillation frequency.

German Offenlegungsschrift No. 2,164,227 discloses an analog-to-digital converter which operates at a constant counting frequency and is therefore able to utilize a crystal-controlled oscillator. In that converter, the sawtooth generator, which produces the ramp voltage that is connected in polarity opposition to the measured value, is associated with an analog memory circuit whose charge and therefore whose output voltage is influenced at the end of each counting procedure or at the end of the measuring phase if the sawtooth voltage potential then obtained deviates from a pre-defined reference voltage. However, a disadvantage of such analog-to-digital converters having calibration provisions is the inability to determine at any given time whether the analog-to-digital converter is operating with an accuracy that is within an acceptable tolerance range or whether completely erroneous output values have been given by the converter.

Since maximum precision in analog to digital conversion is necessary for some applications, for example, in the weighing of goods, the primary object of the invention is to provide a method and apparatus for automatically recalibrating and testing the accuracy of an analog-to-digital converter, where a permissible tolerance range can be predefined and it is possible to determine whether the analog-to-digital converter operates within that tolerance range.

In the invention, the sawtooth reference voltage is allowed to continue beyond the end of the measuring interval at which time the sawtooth voltage is connected in opposition to a reference datum voltage. A control pulse of defined duration is generated and steps are taken to determine whether the time of identity of the reference voltage with the sawtooth voltage occurs within the duration of the control pulse.

According to the invention, a pulse generating circuit is arranged to be controlled by the operation of a main counter and at the end of the measuring interval produces a control pulse of predefined duration. A monitoring circuit receives the comparator output pulse that is produced when the continuing sawtooth voltage and the reference voltage connected in polarity opposition thereto are identical, whereby the absence of readiness for operation of the converter can be detected when the tolerance is exceeded and the accuracy of the converter can then be evaluated.

An important advantage of the invention is the elimination of the need for having a known input analog voltage available to test the accuracy of the converter and enable the conversion results to be evaluated to determine whether the deviations are still within an acceptable tolerance range. In the invention, in the calibration-phase, a tolerance range test is performed in which the reference voltages that are present in the analog-digital converter for calibration purposes are utilized.

Figure 2:
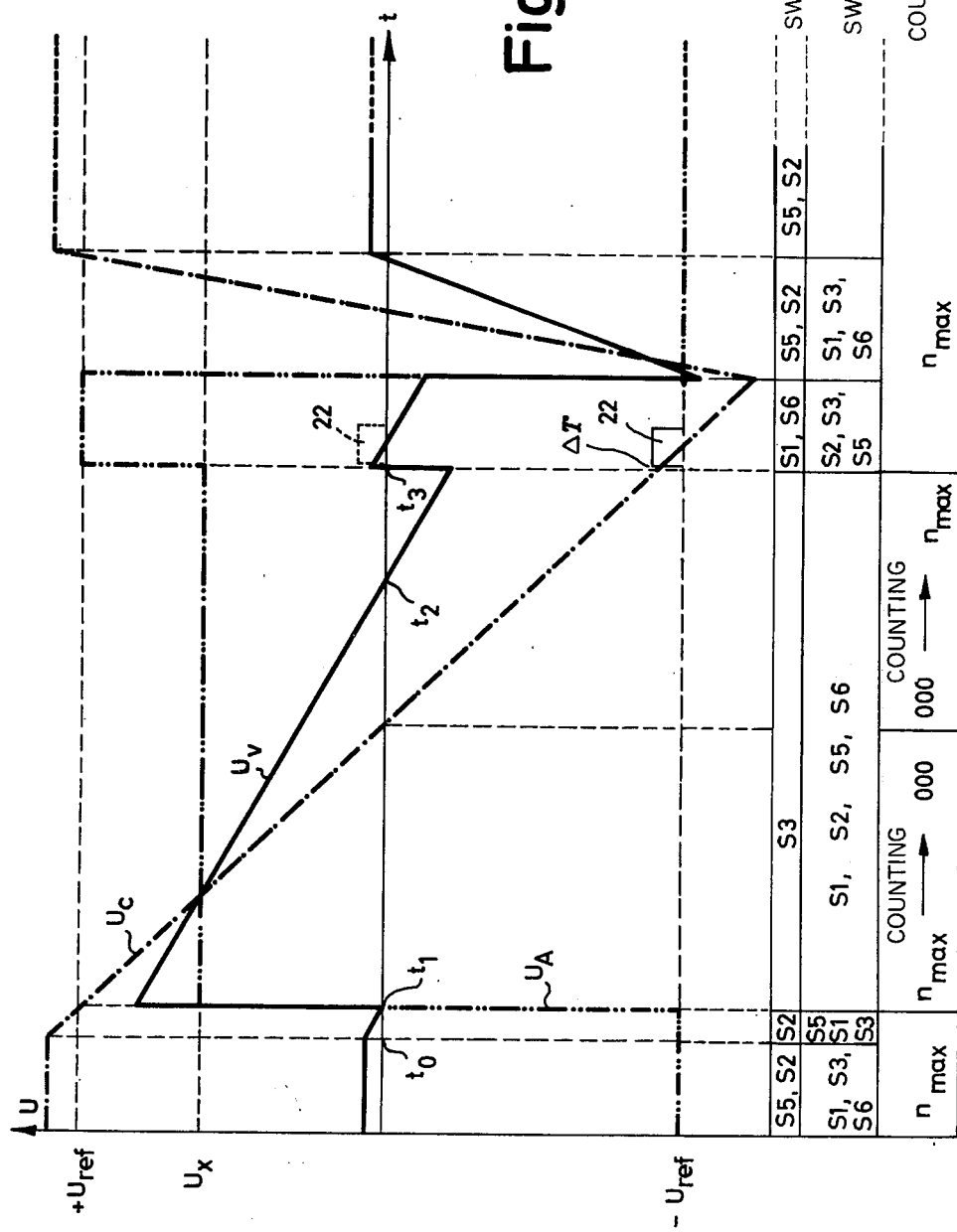

The invention, both as to its construction and mode of operation, can be better understood from the following detailed description when it is considered in conjunction with the accompanying drawing, in which:

FIG. 1 is a schematic diagram showing the preferred arrangement of an analog-to-digital converter embodying the invention, FIG. 2 shows waveforms and voltage levels pertaining to the operation of the analog-to-digital converter of FIG. 1.

The system according to the invention is particularly suited as an extension and improvement of the analog-to-digital converter described in the German Offenlegungsschrift No. 2,164,227.

Before treating the calibration procedure in greater detail, it is appropriate, in order to facilitate an understanding of the invention, to explain the arrangement and method of operation of the system according to the invention by reference to the schematic diagram of FIG. 1 and to explain the characteristics of FIG. 2 in detail. The measuring phase will be described first.

To measure the unknown voltage $U_x$, which can be generated in any desired manner and is supplied as an analog signal to the input terminal 1 of the circuit of FIG. 1, the switch S3 is closed so that the signal is applied to the junction P1 via a resistor 2. A sawtooth voltage, generated by an oscillator 4, is connected by resistor 3 in opposition to the analog voltage $U_x$. The sawtooth oscillator 4 is a conventional operational amplifier with a feedback capacitor 5 connected to cause the arrangement to operate as an integrator. The junction P1 is connected to one input of a comparator 6 of high sensitivity which is constructed to sense with a high degree of accuracy when the two voltages applied to the junction P1 are equal.

Prior to the beginning of the measuring phase, the sawtooth oscillator 4 is connected to a voltage terminal of suitable polarity by closing the switch S5 and is driven to a top limiting value. The integrator 4 then integrates downwardly from that top limiting value and produces the voltage characteristic designated $U_c$ in FIG. 2 and shown in dash-dot lines, extending linearly between the two reference voltages $+U_{ref}$ and $-U_{ref}$.

The top integrator voltage output value and therefore the time at which the counter, operating parallel with the sawtooth oscillator 4 commences counting, is first determined. At the beginning of the measuring phase, the forward-reverse counter 7 of FIG. 1 is at its maximum counter value which it reached in the preceding measuring phase and retained during the succeeding calibration phase. A control system, designated in its entirety by the number 8 in FIG. 1 and containing in addition to the above mentioned circuit components other circuit components adapted to ensure an ordered operation of the entire system which need not however be described in detail, again opens the switch S5 and with the switch S3 open, initially connects the negative reference voltage $-U_{ref}$ via the resistor 2 in polarity opposition to the integrator output voltage through the switch S2 which will then be closed in order to determine the time $t_1$ which begins the measuring phase and the start of counting by the counter 7. The voltage characteristic at junction P2 is indicated by the voltage waveform $U_A$ in FIG. 2 which has two dots between the dashes; during the actual measuring phase that voltage corresponds to the unknown measured voltage $U_x$. The voltage $U_V$ applied to junction P1 is shown by the solid line and represents the input voltage to the comparator 6. As can be seen, the negative reference voltage $-U_{ref}$ is initially negatively smaller than the sawtooth output voltage $U_C$ which is integrated downwardly from positive voltage values. The integrator or sawtooth oscillator 4 therefore operates from time $t_o$ to $t_1$, at which time the input voltage to the comparator 6 becomes zero. The output voltage of the comparator thereupon changes and that signal passes via the conductor 10 to the control system 8 which then releases the counting pulses originating from the oscillator or clock generator 12 via the line 11. With the aid of conventional circuit elements, for example trigger circuits, gate circuits and the like, the counting pulses are transmitted via the conductor 13 to the forward-reverse counter 7. Simultaneously, at time $t_1$, switch S2 is opened and switch S3 is closed so that the voltage at the junction P2 then assumes the value of the analog voltage $U_x$.

As can be seen by reference to the graph in FIG. 2, an analog-to-digital converter of this kind is arranged so that any desired unknown positive and negative analog input voltages can be measured within specific limits; it is of course possible to design a system of this kind so that it measures only positive input voltages or only input voltages which can become negative only by a specific percentage value.

From time $t_1$ onwards, integrator 4 and the counter 7 operate in the reverse direction towards zero from their extreme values (i.e. from the counter state $n_{max}$ or from the identical integrator output voltage $U_c$ connected in polarity opposition to the negative reference voltage $-U_{ref}$), the counter state at any time being a measure of the output voltage $U_c$ of the sawtooth oscillator 4. If the counter 7 and the sawtooth oscillator 4 pass through zero, which is the case if a positive unknown measured input voltage $U_x$ is supplied to the analog-to-digital converter since the measured voltage in the case of negative measured voltage values is oppositely identical to the integrator output voltage prior to the zero counter state, the counter 7 will then automatically count in the forward direction and suitable means which detect the passing of the count through zero can also determine and display the sign of the analog input voltage.

If the analog voltage $U_x$ at time $t_2$ is positively equal to the negative sawtooth voltage $U_c$, the input voltage $U_v$ of the comparator 6 will pass through zero and the comparator will cause the control system 8 to transfer the counter contents at that moment to the register 16, a procedure which can be performed by a suitable shift pulse produced on the conductor 15 by the control system 8. The register will then acquire a counter state which corresponds to the digital value of the analog voltage $U_x$.

After the counter contents have been transferred to the serially connected register 16, the counter and integrator continue to operate independently of the triggering shift pulse, as indicated in FIG. 2, until the counter reaches its extreme counter state $n_{max}$.

This maximum counter state of the counter 7 must be related to the value of the voltage which the sawtooth oscillator 4 reaches at that time because accuracy of the analog digital conversion is ensured only if the correlation in this case is precisely maintained and does not drift. The final integrator output voltage value thus reached is however defined by the voltage supplied by memory circuit 20 to the sawtooth oscillator 4 as an input voltage to be integrated. The slope and the final value reached by the sawtooth oscillator output voltage as well as recalibration or adjustment of the sawtooth voltage to the counter state then takes place in response to the magnitude of the signal contributed by the memory circuit 20 to the input of the integrator.

On reaching its maximum counter state, the forward-reverse counter 7 initiates the calibration phase in the operation of the invention. Triggered by an output signal from counter 7 obtained by tapping off a voltage from the last counter digit, calibration is performed by closing switch S1 to connect the positive reference voltage $+U_{ref}$ in polarity opposition to the final value of the retained output voltage of the sawtooth generator 4 obtained at the maximum counter state $n_{max}$. If those voltages are equal, the comparator signal will not give rise to any readjustment; if there is a difference, the comparator 6 will take steps to influence the memory circuit 20 so that the output voltage of the sawtooth oscillator 4 is adjusted for the next measuring cycle or by altering the stored voltage to be integrated by the sawtooth oscillator 4 to correct the detected deviation before the next measuring phase ensues.

This does not however mean that no measurement is possible in the absence of precise equality and the invention provides means for reliable testing and calibration of the analog-to-digital converter without substantial complexity. Intrinsically, such an analog-to-digital converter could be calibrated by connecting a known analog voltage to the input terminal 1, at periodic intervals, and this must then give rise to a specific output counter signal which may deviate only within very narrow tolerances, for example two counting steps in the upward or downward direction, from a counter state of 10,000. However, a surprisingly simple solution of such recalibration is obtained by proceeding in accordance with an inventive step in which the connection of the positive reference voltage $U_{ref}$, performed in any case at the end of each measuring cycle for recalibration of the memory circuit 20, is utilized to simultaneously define the state of calibration of the analog-to-digital converter by itself together with its accuracy characteristic.

If the integrator voltage (i.e. the output voltage of the sawtooth oscillator 4) is allowed to continue after the maximum counter state $n_{max}$ has been reached and if the reference voltage is connected at this time, while simultaneously presetting a minimum time (defined by the tolerance conditions) within which the integrator output voltage and the reference voltage must be equal and opposite to each other, it will be certain that the precision of the system will be within the tolerance range if identity of reference voltage and integrator voltage occurs within the preset time interval, the duration of which is defined by a control pulse 22 generated by the control system 8 and shown in FIG. 2. The control pulse 22 can be indirectly derived from the frequency of the clock generator 12 whose pulse repetition rate must be strictly proportional to the rise of sawtooth voltage. Forcing such synchronism between the frequency of the clock generator (which can be readily stepped down by known circuit means depending on requirements) and the characteristic of the sawtooth voltage is the principal reason for the presence of the memory circuit 20 and the use of the above-mentioned reference voltages. The calibration phase which occurs after each measuring procedure adjusts the sawtooth voltage to the oscillator frequency and the memory circuit 20, which makes available the voltage to be integrated by the sawtooth oscillator 4, is influenced during the calibration phase in a manner which will be described in detail below.

It will be understood that, in contrast to the waveform characteristic of FIG. 2, the sawtooth voltage generated by the integrator can also rise in the upward direction; this merely involves reversal of the existing circuit facilities. The switching function to be carried out by the control system 8, more particularly in the measuring phase (the calibration phase will be dealt with below) can be performed in the simplest case by gate-controlled circuit systems.

FIG. 2 shows that the control pulse 22, whose duration defines the width of the acceptable tolerance as regards accuracy of the analog-to-digital converter, is comparatively closely spaced from time $t_3$ when counter 7 reaches its maximum count and switch S1 is closed by a switching signal to cause the positive reference voltage to be connected into the circuit. The time interval $\Delta T$ is necessary so that transient phenomena which arise from the connection of the said reference voltage into the circuit can decay before coincidence comparison with the sawtooth voltage is performed.

Although a preferred mode of performing an essential part of the calibration phase is explained in detail hereinbelow, it will be understood that the generation of the control pulse 22 and scanning of the voltage conditions at the output of the comparator 6 within the time defined by such scanning can also be performed by other suitable circuit means.

As soon as the counter 7 reaches its maximum position $n_{max}$, the control system 8 is supplied via the conductor 22 with a pulse which can be produced, for example by advancing of the last digit of the counter 7. This pulse, which can also interrupt the supply of further counting pulses to the counter 7 by making use of suitable gate control, drives a bistable trigger stage 23 the output of which produces a so-called ME (measuring phase end) pulse. That ME signal enables a serially connected clock generator 24 which thereupon emits a number of counting cycles, for example 10 counting cycles, to a decoded decade counter. A decoded decade counter of this kind can for example be a so-called "Johnson" counter which is encoded so that in the course of the cyclic routine a high potential or the logic 1 state occurs on ten of its output terminals for a specific period of time. A routine made available by such a decoded decade counter 25 is utilized for generating the individual switching functions. The control pulse 22 is generated at the output of an AND-gate 26 and passes to a serially connected bistable flip-flop (D flip flop) 27 and to the input of a switch S6 which is a field-effect transistor in the illustrated embodiment and connects the output of the comparator 6 to the input 28 of the memory circuit 20. Control pulse 22 is generated by coupling the output signal, which rises at a specific time, and is coupled to one of the outputs of the decoded decade counter 25 (in this case tapped from the output O) to the counting cycle of the clock generator 24. This coupling operation is not absolutely essential but it was chosen for the present embodiment so that the effective duration of the control pulse 22 should be 0.35 microseconds in relation to the other time routines. This duration can be achieved by the above-mentioned coupling. However, the expert will understand that such a switching pulse can be produced and evaluated in different manner by suitable circuit means after a maximum counter state has been achieved.

The control pulse 22 passes to the "D" input of the monitoring flip-flop 27 after this has been set at the end of each calibrating phase by the decoded nine on the decade counter 25.

On the other hand, the comparator 6 is so constructed, as can be seen from the view of FIG. 2, that its output potential changes suddenly when the input signal passes through zero level, in the exemplified embodiment from a negative voltage to a positive voltage. If the changing pulse arrives at the time at which the switching pulse from AND-gate 26 is applied to the flip-flop 27, the latter will take over the switching pulse and the output potential of the flip-flop 27 will be changed and correspondingly evaluated and simultaneously indicate that the analog-to-digital converter is synchronized since, after reaching the maximum counter state, the sawtooth voltage is equal and opposite to the connected reference voltage within a predefined tolerance time.

Changeover of the flip-flop 27 can be effected in any desired manner, for example in the illustrated embodiment changeover is effected by a serially connected transistor 30 being driven into the conductive state so that a light-emitting diode 32, connected via a resistor 31 to the collector of the transistor 30, is lit thus indicating that the apparatus is ready for operation and is reliably calibrated. The output signal can be further utilized to block the operating routine or the measuring phase until synchronization is finally achieved and/or to indicate a state of overloading or a non-operative state.

In the ideal case the reference voltage $+U_{ref}$ connected in parallel opposition, passes through the control pulse in its middle with respect to time, as shown in FIG. 2, with the result that the input of the comparator 6 is high during the first half of the control pulse 22 and low during the second half with a corresponding, reversed potential distribution on the comparator output but the comparator output displays a step response characteristic in the presence of a zero input potential.

The output of the comparator 6 is connected via the conductor 35 and a field effect transistor switch S6 to the input of the memory circuit which is preferably constructed as an integrator employing an operational amplifier having a feedback capacitor 36 connected across the input and output. If the output step response function or the changeover switching time of comparator 6 is precisely in the middle of the control pulse 22, the switch S6 which connects the output potential of the comparator to the input of the memory 20, it will be seen that the integrator does not alter the control voltage emitted from it to the serially connected sawtooth oscillator 4 because the integrator integrates in the upward and downward direction to the same extent. If the zero mode of the comparator 6 shifts within the predefined tolerance time, this will result in a corresponding change because either the negative or the positive potential is retained longer on the input of the integrating memory 20, the change being the greater the more the zero mode has been shifted from the middle of the control signal duration. This part of the circuit therefore functions as a proportional controller and achieves synchronization of the components forming the analog-to-digital converter within the time which decreases with an increase in the magnitude of the relevant deviation. If zero occurs outside the pre-defined tolerance time (corresponding to the duration of the control pulse 22), the analog-to-digital converter will not be in operation as already described; however, it achieves its operational state within a few cycles, not least because of the proportional characteristics which accompany the compensation of the deviation. To summarize, it can be said that maintaining synchronization and calibration is monitored substantially by digital means while recalibration and influencing of the memory circuit 20 is performed by means of analog control.

In the illustrated embodiment of FIG. 1, the first flip-flop 23 in the circuit series is reset by the pulse which appears at the output of the decoded zero of the decade counter 25 and is differentiated by the RC network 40, 41, so that the flip-flop 23 is again triggered into the "measurement" state and the calibration phase is terminated. In FIG. 2, the integrated output voltage of the sawtooth oscillator 4 continues until the switches S5 and S3 are closed, for example by another switching pulse, and the previously-mentioned potential distribution state is again obtained. Some data regarding the switch position of all the switches S1 to S6 appear beneath the waveforms in FIG. 2 and it will be understood that the remaining switches, to the extent to which they are required, can be replaced by corresponding semiconductor circuit elements, for example field-effect transistors. The integrator is set into its starting position for the next measuring phase via a field-effect transistor 42 (FIG. 1) by means of a switching signal emitted by the control system 8. That switching signal can be obtained, for example, by connection to the conductor 43 of a suitable output potential of the decoded decade counter 25, at a suitable raster spacing with respect to time, and the outputs of the decoded decade counter 25 can generally also be utilized for performing other required switching functions. Resetting the first flip-flop to the "measurement" state also gives rise to an output signal, indicated by the arrow 44, which can be used for performing switching functions, for example closing of the switches S2 and S5.

One preferred field of application of such an analog-to-digital converter is for weighing; in that case an unknown voltage, proportional to an unknown weight, is supplied to the input terminal 1 and the weight is indicated with a high degree of precision in a matter of seconds.

One particularly advantageous embodiment of the present invention employs a bridge circuit for defining the weight, one branch of the bridge having a pressure-sensitive sensor or resistor which is exposed to the unknown weight. If this bridge is fed with a suitable reference voltage, to which end it is possible to utilize the reference voltages which are in any case available, the accuracy of the system can be increased still further because the reference voltages also service simultaneously for calibration and synchronization purposes.

Finally, it should be pointed out that the circuit components within the control system 8 which come into operation during the calibrating phase merely represent one possible embodiment; for example, it is feasible that a suitable circuit element, for example a monostable element, which is triggered after completion of the counting operation of the main counter 7, generates a pulse of variable length which is then supplied to a gate circuit the other input of which is connected to the output of the comparator 6 and is constructed so that other switching functions are initiated or the operational reliability of the apparatus is indicated only if both pulses occur simultaneously.

I claim:

1. The method of recalibrating and testing the accuracy of an analog-to-digital converter of the type having
   (1) a signal generator for producing a linearly changing ramp reference signal whose slope can be changed,
   (2) an oscillator for generating clock pulses,
   (3) a counter for counting clock pulses during a measuring phase of the converter,
   (4) a comparator for providing an output signal when the ramp reference signal magnitude reaches the level of the analog input signal, and
   (5) means establishing a voltage datum,
the method comprising the steps of
   (a) allowing the linearly changing ramp reference signal to continue to be generated beyond the end of the measuring phase of the converter, (b) at the end of the measuring phase connecting the voltage datum in opposition to the ramp reference signal as inputs to the comparator, (c) generating a control pulse of fixed duration after the end of the measuring phase, and (d) ascertaining whether the reference signal becomes equal in magnitude to the voltage datum within the duration of the control pulse.

2. The method according to claim 1, further including the steps of (e) for the duration of the control pulse, applying the output of the comparator to an integrator memory device which supplies a control signal to the signal generator to control the slope of the ramp.

3. In an analog-to-digital converter of the type having (1) a signal generator for producing a linearly changing reference signal whose slope can be changed, (2) an oscillator for generating clock pulses, (3) a counter for counting clock pulses during a measuring phase which begins when the reference signal reaches an initial voltage level and ends when the count attains a predetermined value, (4) a comparator for providing an output signal when the magnitude of the reference signal reaches the level of the input analog signal, the output signal causing read out of the count then in the counter, and (5) means establishing at least one voltage datum, the improvement of a calibration phase in which the linearly changing reference signal produced by the signal generator in the measuring phase is continued to be produced into the calibration phase which follows the measurement phase, the improvement comprising (a) means controlled by the counter for producing a control pulse of fixed duration after the measuring phase, (b) switch means operative at the end of the measuring phase for connecting the voltage datum in opposition to the linearly changing reference signal as inputs to the comparator, and (c) means responsive to the output of the comparator for indicating whether the magnitude of the reference signal becomes equal to the voltage datum within the duration of the control pulse.

4. The improved analog-to-digital converter according to claim 3, wherein the improvement further comprises (d) a memory device having its output coupled to provide a signal to the input of the signal generator to control the slope of the reference signal, the memory device functioning to integrate the signals applied to its input, and (e) switch means for coupling the output of the comparator to the input of the memory device for the duration of the control pulse.

5. The improved analog-to-digital converter according to claim 4, in which the means for producing the control pulse includes a decoded decade counter, and wherein the improvement further comprises (f) a bistable device having the control pulse applied to one input and the output of the comparator coupled to its other input whereby the bistable device changes states only if a triggering output from the comparator occurs within the duration of the control pulse.

6. The improved analog-to-digital converter according to claim 5, wherein the improvement further comprises (g) a flip-flop responsive to a trigger signal emitted by the counter at the end of the measuring phase, (h) a timing generator coupled to the output of the flip-flop for providing timing signals to the input of the decoded decade counter.

* * * * *